US011631580B2

(12) United States Patent
Lei et al.

(10) Patent No.: US 11,631,580 B2
(45) Date of Patent: Apr. 18, 2023

(54) FORMULATION FOR DEPOSITION OF SILICON DOPED HAFNIUM OXIDE AS FERROELECTRIC MATERIALS

(71) Applicant: VERSUM MATERIALS US, LLC, Tempe, AZ (US)

(72) Inventors: Xinjian Lei, Vista, CA (US); Matthew R. MacDonald, Laguna Niguel, CA (US); Moo-Sung Kim, Gyeonggi-do (KR); Se-Won Lee, Gyeonggi-do (KR)

(73) Assignee: Versum Materials US, LLC, Tempe, AZ (US)

( * ) Notice: Subject to any disclaimer, the term of this patent is extended or adjusted under 35 U.S.C. 154(b) by 0 days.

(21) Appl. No.: 17/375,996

(22) Filed: Jul. 14, 2021

(65) Prior Publication Data

US 2022/0189767 A1    Jun. 16, 2022

Related U.S. Application Data

(62) Division of application No. 15/914,968, filed on Mar. 7, 2018, now Pat. No. 11,081,337.

(Continued)

(51) Int. Cl.
*H01L 21/02* (2006.01)
*C23C 16/40* (2006.01)
(Continued)

(52) U.S. Cl.
CPC .......... *H01L 21/02148* (2013.01); *C09D 1/00* (2013.01); *C09D 5/24* (2013.01);
(Continued)

(58) Field of Classification Search
None
See application file for complete search history.

(56) References Cited

U.S. PATENT DOCUMENTS

| 6,743,473 B1 | 6/2004 | Parkhe |
| 7,470,470 B2 | 12/2008 | Senzaki |

(Continued)

FOREIGN PATENT DOCUMENTS

| EP | 2650399 A2 | 10/2013 |
| JP | 2002191265 A | 12/2003 |

(Continued)

OTHER PUBLICATIONS

Claudia Richter, M. H.P., et al., "Impact of ALD processing on non-volatile memory performance of ferroelectric HfO2 based capacitors", 16th International Conference on Atomic Layer Deposition. Jul. 24-27, 2016, Dublin, Ireland.

(Continued)

*Primary Examiner* — Katie L. Hammer
(74) *Attorney, Agent, or Firm* — Daniel A. DeMarah, Jr.

(57) ABSTRACT

In one aspect, the invention is formulations comprising both organoaminohafnium and organoaminosilane precursors that allows anchoring both silicon-containing fragments and hafnium-containing fragments onto a given surface having hydroxyl groups to deposit silicon doped hafnium oxide having a silicon doping level ranging from 0.5 to 8 mol %, preferably 2 to 6 mol %, most preferably 3 to 5 mol %, suitable as ferroelectric material. In another aspect, the invention is methods and systems for depositing the silicon doped hafnium oxide films using the formulations.

9 Claims, 3 Drawing Sheets

Related U.S. Application Data

(60) Provisional application No. 62/471,647, filed on Mar. 15, 2017.

(51) Int. Cl.
| | | |
|---|---|---|
| *C23C 16/455* | (2006.01) | |
| *C23C 16/50* | (2006.01) | |
| *C09D 5/24* | (2006.01) | |
| *C09D 1/00* | (2006.01) | |
| *H01L 49/02* | (2006.01) | |
| *H01L 27/11507* | (2017.01) | |
| *C09D 7/40* | (2018.01) | |

(52) U.S. Cl.
CPC .......... *C23C 16/401* (2013.01); *C23C 16/405* (2013.01); *C23C 16/45529* (2013.01); *C23C 16/45531* (2013.01); *C23C 16/45536* (2013.01); *C23C 16/45553* (2013.01); *C23C 16/50* (2013.01); *H01L 21/0228* (2013.01); *H01L 21/02211* (2013.01); *H01L 21/02219* (2013.01); *H01L 21/02274* (2013.01); *C09D 7/40* (2018.01); *H01L 27/11507* (2013.01); *H01L 28/40* (2013.01)

(56) References Cited

U.S. PATENT DOCUMENTS

| 9,053,802 | B2 | 6/2015 | Muller et al. |
|---|---|---|---|
| 2002/0187644 | A1 | 12/2002 | Baum |
| 2005/0233156 | A1 | 10/2005 | Senzaki |
| 2006/0110930 | A1 | 5/2006 | Senzaki |
| 2008/0119057 | A1 | 5/2008 | Chua |
| 2008/0299312 | A1 | 12/2008 | Itsuki et al. |
| 2009/0203222 | A1 | 8/2009 | Dussarrat |
| 2013/0129940 | A1 | 5/2013 | Xiao |
| 2013/0295779 | A1 | 11/2013 | Chandra |
| 2014/0287592 | A1 | 9/2014 | Chung |
| 2014/0322924 | A1 | 10/2014 | Dussarrat |

FOREIGN PATENT DOCUMENTS

| JP | 2004 100003 A | 4/2004 |
|---|---|---|
| JP | 2004100003 A | 4/2004 |
| KR | 101284664 | 7/2013 |
| WO | 2002/079211 A1 | 10/2002 |
| WO | 2006/023501 A2 | 3/2006 |
| WO | 2013/112727 A1 | 8/2013 |

OTHER PUBLICATIONS

Boescke, T. S., et al. "ferroelectricity in hafnium oxide thin films." Appl. Phys. Lett., 99(10), 2011, 102903/102901-102903/102903.

Hoffmann, M., et al., Hoffmann, "Ferroelectric phase transitions in nanoscale HfO2 films enable giant pyroelectric energy conversion and highly efficient supercapacitors." Nano Energy 18, 2015, pp. 154-164.

Mueller, S., et al., "Ten-nanometer ferroelectric Si:HfO2 films for next-generation FRAM capacitors." IEEE Electron Device Lett. 33(9), 2012, pp. 1300-1302.

Park, M. H., et al., "Ferroelectricity and Antiferroelectricity of Doped Thin HfO2-Based Films." Adv. Mater. (Weinheim, Ger.) 27(11):, 2015, pp. 1811-1831.

Senzaki, Yoshihide, et al. "Atomic Layer Deposition of Hafnium Oxide and Hafnium Silicate Thin Films Using Liquid Precursors and Ozone." Journal of Vacuum Science and Technology; Part A., AVS/AIP, Melville, NY., vol. 22, No. 4. Jul. 1, 2004, pp. 1175-1181.

FORMULATION FOR DEPOSITION OF SILICON DOPED HAFNIUM OXIDE AS FERROELECTRIC MATERIALS

CROSS-REFERENCE TO RELATED APPLICATIONS

This patent application is a divisional of U.S. non-provisional patent Ser. No. 15/914,968, filed Mar. 7, 2018, which claims the benefit of U.S. provisional patent application Ser. No. 62/471,647 filed on Mar. 15, 2017 and 62/477,812 filed on Mar. 28, 2017. All applications are hereby incorporated by reference in their entirety.

FIELD OF THE INVENTION

The invention relates to formulations which can be used to deposit silicon doped hafnium oxide as ferroelectric materials for electrical memory applications.

BACKGROUND OF THE INVENTION

Described herein are novel formulations or compositions (they are exchangeable), methods, and systems comprising same to deposit silicon doped hafnium oxide via a thermal atomic layer deposition (ALD) or plasma enhanced atomic layer deposition (PEALD) process, cyclic chemical vapor deposition, plasma enhanced cyclic chemical vapor deposition or a combination thereof.

More specifically, described herein is a composition, method and systems for formation of a silicon doped hafnium oxide having a silicon doping level ranging from 2 to 6 mol. % at one or more deposition temperatures of about 600° C. or less including, for example, from about 200° C. to about 350° C.

Atomic Layer Deposition (ALD) and Plasma Enhanced Atomic Layer Deposition (PEALD) are current processes used to deposit silicon doped hafnium oxide employing super cycle approaches, i.e. many cycles of hafnium oxide followed by one or a few cycles of silicon oxide to control the amount of silicon dopant to provide ferroelectric material upon annealing the resulting nanolaminates to crystallize into orthorhombic phase.

In both ALD and PEALD processes, the precursors and reactive gas (such as oxygen, oxygen plasma, ozone, or water) are separately pulsed in certain number of cycles to form a multiple layers of hafnium oxide and a monolayer of silicon oxide at each super cycle. However, the silicon dopants may not homogenously distribute into the crystal lattice, which may be detrimental in the performance of ferroelectric materials in semiconductor applications. To remedy this, one possible solution is to co-deposit both silicon oxide and hafnium oxide at each ALD or PEALD cycle, allowing better inter-mixing of silicon and hafnium atoms, followed by thermal annealing to crystalize into proper orthorhombic phase suitable as ferroelectric material.

Examples of known precursors and methods are disclosed in the following publications, patents, and patent applications.

Claudia Richter, M. H. P., Tony Schenk, Robin Materlik, Christopher Kuenneth, Alfred Kersch, Cheol Seong Hwang, Thomas Mikolajick, Uwe Schroeder (2016). Impact of ALD processing on non-volatile memory performance of ferroelectric $HfO_2$ based capacitors. 16th International Conference on Atomic Layer Deposition. 24th -27th July 2016, Dublin, Ireland.

Recently, the ferroelectric behavior of thin doped hafnium oxide films caused by a non centrosymmetric orthorhombic phase was reported [Boescke, T. S., Mueller, J., Braeuhaus, D., Schroeder, U. and Boettger, U. (2011). "ferroelectricity in hafnium oxide thin films." Appl. Phys. Lett. 99(10): 102903/102901-102903/102903.].

In the following years, novel memory devices using $HfO_2$ as a non-volatile storage layer were proposed. Continuous research was ongoing to understand the root cause of this so far unknown phase. Accordingly, the ferroelectric properties and crystal structure of doped $HfO_2$ thin films were investigated. Piezo-response force microscopy (PFM) in conjunction with transmission electron microscopy (TEM) measurements revealed a domain size in the order of single doped $HfO_2$. After implementation of doped HfO grains with a diameter of ~20-30 nm for 10 nm thick films. After implementation of doped $HfO_2$ in a ferroelectric random access memory (FRAM) capacitor, important parameters for non-volatile data storage were characterized: e.g. remanent polarization, wake-up performance, endurance, fatigue and imprint together with typical dielectric properties like leakage current and dielectric constant. Ferroelectric Si doped $HfO_2$ films were processed by pulsing a certain amount of $SiO_x$ subcycles (silanediamine, N,N,N',N'-tetraethyl/$O_2$ plasma) during $HfO_2$ deposition (tetrakis(ethylmethylamino)Hafnium/$H_2O$). The position of single $SiO_x$ subcycles was optimized. A distance of 21 $HfO_2$ cycles of the first $SiO_x$ layer to the bottom electrode led to an improvement in remanent and relaxed polarization (after 1 s) at similar wake-up behavior of the ferroelectric layer. In parallel, the cycling endurance could be increased by a factor of 10-100. $SiO_2$ or $Al_2O_3$ interlayers within the ferroelectric material could further improve the ferroelectric memory properties of the capacitor structure as long as the doped $HfO_2$ thickness was beyond a minimum thickness. Overall, results suggest a limited Si diffusion within the $HfO_2$ ab initio simulations confirmed the influence of doping distribution and oxygen vacancies on the phase stability of ferroelectric HfO even after a 1000° C. anneal Hoffmann, M., Schroeder, U., Kuenneth, C., Kersch, A., Starschich, S., Boettger, U. and Mikolajick, T. (2015). "Ferroelectric phase transitions in nanoscale $HfO_2$ films enable giant pyroelectric energy conversion and highly efficient supercapacitors." Nano Energy 18: 154-164. Temp.—and field-induced phase transitions in ferroelectric nanoscale TiN/Si:$HfO_2$/TiN capacitors with 3.8 to 5.6 mol % Si content are investigated for energy conversion and storage applications. Films with 5.6 mol % Si concentration exhibit an energy storage d. of ~40 $J/cm^3$ with a very high efficiency of ~80% over a wide temp. range useful for supercapacitors. Furthermore, giant pyroelectric coefficients of up to −1300 $\mu C/(m^2 K)$ are observed due to temperature dependent ferroelectric to paraelectric phase transitions. The broad transition region is related to the grain size distribution and adjustable by the Si content. This strong pyroelectricity yields electrothermal coupling factors k2 of up to 0.591 which are more than one order of magnitude higher than the best values ever reported. This enables pyroelectric energy harvesting with the highest harvestable energy d. ever reported of 20.27 $J/cm^3$ per Olsen cycle. Possible applications in IR sensing are discussed. Inversely, through the electrocaloric effect an adiabatic temp. change of up to 9.5 K and the highest refrigerant capacity ever reported of 19.6 J/cm3 per cycle is achievable. This might enable energy efficient on-chip electrocaloric cooling devices. Addnl., low cost fabrication of these films is feasible by existing semiconductor process technol.

Mueller, S., Summerfelt, S. R., Mueller, J., Schroeder, U. and Mikolajick, T. (2012). "Ten-nanometer ferroelectric Si:HfO$_2$ films for next-generation FRAM capacitors." IEEE Electron Device Lett. 33(9): 1300-1302.

Ferroelectric properties of Si-doped HfO$_2$ thin films (10 nm) have been investigated. The focus of this letter is to evaluate the potential applicability of these thin films for future 3-D ferroelectric random access memory capacitors. Polarization switching was tested at elevated temps. up to 185° C. and showed no severe degradation. Domain switching dynamics were elec. characterized with pulse-switching tests and were not in accordance with Kolmogorov-Avrami-type switching. Nucleation-limited switching is proposed to be applicable for these new types of ferroelectric thin films. Furthermore, same-state and opposite-state retention tests were performed at 125° C. up to 20 h. It was found that samples that had previously been annealed at 800° C. showed improved retention of the written state as well as of the opposite state. In addn., fatigue measurements were carried out, and no degradation. occurred for 106 programming and erase cycles at 3 V.

Mueller, S. F., Yurchuk, E. and Schroeder, U. (2014)) "Ferroelectric memory cells for integrated circuits." U.S. Pat. No. 9,053,802 B.

The integrated circuit includes a ferroelectric memory cell. The title ferroelectric memory cell includes a first oxide storage layer, a second oxide storage layer, and an amorphous layer disposed between the first and second oxide storage layers. Each of the first and second oxide storage layers includes a ferroelectric material that is at least partially in a ferroelectric state and further includes, as main components, oxygen and any of the group consisting of Hf, Zr and (Hf,Zr).

Park, J. U., Kim, J. Y., Cho, B. Y., Yoo, G. H., Chae, S. D., Kim, Y. S., Cho, Y. J., Choi, H. M. and Hwang, G. H. (2012)) "Organometallic compounds containing silylamines useful as precursors with good thermal stability for metal oxide or silicon-containing metal oxide deposition." KR101284664 B1.

The invention relates to organometallic compounds having silylamine ligands $(R^1R^2N)_3$-xM(L)(NR$^3$SiR$^4$R$^5$R$^6$)x, wherein M=Si, Ge, Ti, Zr, or Hf; L=halide, C1-6 alkyl, or cyclopentadienyl; R1-6=independently H, C1-6 alkyl, or SiR12R13R14; R12, R13, R14=independently H or C1-6 alkyl; and x=0, 1, 2, or 3.

Park, M. H., Lee, Y. H., Kim, H. J., Kim, Y. J., Moon, T., Kim, K. D., Mueller, J., Kersch, A., Schroeder, U., Mikolajick, T. and Hwang, C. S. (2015). "Ferroelectricity and Antiferroelectricity of Doped Thin HfO$_2$-Based Films." Adv. Mater. (Weinheim, Ger.) 27(11): 1811-1831.

Park et al teaches the progress in ferroelectricity and antiferroelectricity in HfO$_2$-based thin films. Most ferroelectric thin film research focuses on perovskite structure materials, such as Pb(Zr,Ti)O$_3$, BaTiO$_3$, and SrBi$_2$Ta$_2$O$_9$, which are considered to be feasible candidate materials for nonvolatile semiconductor memory devices. However, these conventional ferroelectric materials suffer from various problems including poor Si-compatibility, environmental issues related to Pb, large phys. thickness, low resistance to hydrogen, and small bandgap.

In 2011, ferroelectricity in Si-doped HfO$_2$ thin films was 1st reported. Various dopants, such as Si, Zr, Al, Y, Gd, Sr, and La can induce ferro-electricity or antiferroelectricity in thin HfO$_2$ films. They have large remanent polarization of up to 45 μC cm-2, and their coercive field (≈1-2 MV cm-1) is larger than conventional ferroelectric films by approx. one order of magnitude. Also, they can be extremely thin (<10 nm) and have a large bandgap (>5 eV). These differences are believed to overcome the barriers of conventional ferroelectrics in memory applications, including ferroelectric field-effect-transistors and three-dimensional capacitors. Also, the coupling of elec. and thermal properties of the antiferroelectric thin films are expected to be useful for various applications, including energy harvesting/storage, solid-state-cooling, and IR sensors. There is a need in this art for precursors and methods for depositing silicon doped hafnium oxide containing films which can be thermally annealed to orthorhombic phase as ferroelectric materials used to fabricating future memory devices.

SUMMARY OF THE INVENTION

The present invention solves problems associated with conventional precursors and processes by providing a formulation or composition (formulation and composition are exchangeable) comprising both organoaminohafnium and organoaminosilane precursor compounds that allows anchoring both silicon-containing fragments and hafnium-containing fragments onto a given surface having hydroxyl groups to deposit silicon doped hafnium oxide having silicon doping levels ranging from 0.5 to 8 mol %, preferably 2 to 6 mol %, most preferably 3 to 5 mol %.

In one aspect, the present invention is a composition for depositing a silicon doped hafnium oxide film comprising: (a) at least one organoaminosilane precursor compound having a formula of $R_xR^3Si(NR^1R^2)_{3-x}$; where R is selected from halide (Cl, Br, I) or a linear or branched $C_1$ to $C_6$ alkyl; $R^1$ and $R^2$ are independently selected from linear or branched $C_1$ to $C_6$ alkyl wherein $R^1$ and $R^2$ are linked to form a cyclic ring structure or $R^1$ and $R^2$ are not linked to form a cyclic ring structure; $R^3$ is selected from the group consisting of linear or branched $C_1$ to $C_6$ alkyl; x=0, 1, or 2; and (b) at least one organoaminohafnium precursor compound having a formula of $L_xHf(NR^1R^2)_{4-x}$ wherein L is selected from cyclopentadienyl or alkyl substituted cyclopentadienyl; $R^1$ and $R^2$ are independently selected from linear or branched $C_1$ to $C_6$ alkyl wherein $R^1$ and $R^2$ are linked to form a cyclic ring structure or $R^1$ and $R^2$ are not linked to form a cyclic ring structure, x=0, 1 or 2. It is believed that having $R^3$ group may reduce or increase the reactivity of organoaminosilane precursor towards to hydroxyl group, thus allowing better control of low level silicon doping into hafnium oxide.

In another aspect, the present invention is a method to deposit a silicon doped hafnium oxide film onto a substrate comprising the steps of:

a) providing the substrate in a reactor;

b) introducing into the reactor a composition comprising:
(a) at least one organoaminosilane precursor compound having a formula of $R_xR^3Si(NR^1R^2)_{3-x}$; where R is selected from halide (Cl, Br, I) or a linear or branched $C_1$ to $C_6$ alkyl; $R^1$ and $R^2$ are independently selected from linear or branched $C_1$ to $C_6$ alkyl wherein $R^1$ and $R^2$ are linked to form a cyclic ring structure or $R^1$ and $R^2$ are not linked to form a cyclic ring structure; $R^3$ is selected from the group consisting of linear or branched $C_1$ to $C_6$ alkyl; x=0, 1, or 2; and (b) at least one organoaminohafnium precursor compound having a formula of $L_xHf(NR^1R^2)_{4-x}$ wherein L is selected from cyclopentadienyl or alkyl substituted cyclopentadienyl; $R^1$ and $R^2$ are independently selected from linear or branched $C_1$ to $C_6$ alkyl wherein $R^1$ and $R^2$ are linked to form a cyclic ring structure or $R^1$ and $R^2$ are not linked to form a cyclic ring structure, x=0, 1 or 2;

c) purging the reactor with a purge gas;

d) introducing an oxygen-containing source into the reactor; and e) purging the reactor with the purge gas;

wherein the steps b) through e) are repeated until a desired thickness of film is deposited; and the method is conducted at a temperature ranging from about 100° C. to 600° C.

In yet another aspect, the present invention is also a system to deposit a silicon doped hafnium oxide film onto a substrate comprising: the substrate in a reactor; a composition comprising: (a) at least one organoaminosilane precursor compound having a formula of $R_xR^3Si(NR^1R^2)_{3-x}$; where R is selected from halide (Cl, Br, I) or a linear or branched $C_1$ to $C_6$ alkyl; $R^1$ and $R^2$ are independently selected from linear or branched $C_1$ to $C_6$ alkyl wherein $R^1$ and $R^2$ are linked to form a cyclic ring structure or $R^1$ and $R^2$ are not linked to form a cyclic ring structure; $R^3$ is selected from the group consisting of linear or branched $C_1$ to $C_6$ alkyl; x=0, 1, or 2; and (b) at least one organoaminohafnium precursor compound having a formula of $L_xHf(NR^1R^2)_{4-x}$ wherein L is selected from cyclopentadienyl or alkyl substituted cyclopentadienyl; $R^1$ and $R^2$ are independently selected from linear or branched $C_1$ to $C_6$ alkyl wherein $R^1$ and $R^2$ are linked to form a cyclic ring structure or $R^1$ and $R^2$ are not linked to form a cyclic ring structure, x=0, 1 or 2; and the system is at a temperature ranging from 100° C. to 600° C.

The composition for depositing a silicon doped hafnium oxide film further comprises: (c) a solvent.

In one aspect, the present invention is also a vessel or container employing a composition or a composition with a solvent; wherein the composition comprises at least one of (a) at least one organoaminosilane precursor compound having a formula of $R_xR^3Si(NR^1R^2)_{3-x}$; where R is selected from halide (Cl, Br, I) or a linear or branched $C_1$ to $C_6$ alkyl; $R^1$ and $R^2$ are independently selected from linear or branched $C_1$ to $C_6$ alkyl wherein $R^1$ and $R^2$ are linked to form a cyclic ring structure or $R^1$ and $R^2$ are not linked to form a cyclic ring structure; $R^3$ is selected from the group consisting of linear or branched $C_1$ to $C_6$ alkyl; x=0, 1, or 2; and (b) at least one organoaminohafnium precursor compound having a formula of $L_xHf(NR^1R^2)_{4-x}$ wherein L is selected from cyclopentadienyl or alkyl substituted cyclopentadienyl; $R^1$ and $R^2$ are independently selected from linear or branched $C_1$ to $C_6$ alkyl wherein $R^1$ and $R^2$ are linked to form a cyclic ring structure or $R^1$ and $R^2$ are not linked to form a cyclic ring structure, x=0, 1 or 2.

Examples of suitable organoaminosilane precursors that may be used with the method disclosed herein include, but are not limited to, tris(dimethylamino)methylsilane, tris(diethylamino)methylsilane, tris(ethylmethylamino)methylsilane, tris(pyrrolidino)methylsilane, tris(dimethylamino)ethylsilane, tris(diethylamino)ethylsilane, tris(ethylmethylamino)ethylsilane, tris(pyrrolidino)ethylsilane, bis(dimethylamino)dimethylsilane, bis(diethylamino)dimethylsilane, bis(ethylmethylamino)dimethylsilane, bis(pyrrolidino)dimethylsilane, bis(dimethylamino)diethylsilane, bis(diethylamino)diethylsilane, bis(ethylmethylamino)diethylsilane, bis(pyrrolidino)diethylsilane, dimethylaminotrimethylsilane, diethylaminotrimethylsilane, ethylmethylaminotrimethylsilane, pyrrolidinotrimethylsilane, dimethylaminotriethylsilane, diethylaminotriethylsilane, ethylmethylaminotriethylsilane, pyrrolidinotriethylsilane, dimethylaminophenyldimethylsilane, diethylaminophenyldimethylsilane, ethylmethylaminophenyldimethylsilane, pyrrolidinophenyldimethylsilane, tris(dimethylamino)phenylsilane, tris(diethylamino)phenylsilane, tris(ethylmethylamino)phenylsilane, tris(pyrrolidino)phenylsilane, 1-dimethylamino-1,1,3,3,3-pentamethyldisiloxane, 1,1,1,4,4,4-hexakis(dimethylamino)-1,4-disilabutane, 2,5-bis(dimethylamino)-2,5-dimethyl-2,5-disilahexane and combinations thereof.

Examples of suitable organoaminohafnium precursors that may be used with the method disclosed herein include, but are not limited to tetrakis(dimethylamino)hafnium (TDMAH), tetrakis(diethylamino)hafnium (TDEAH), tetrakis(ethylmethylamino)hafnium (TEMAH), tetrakis(pyrrolidino)hafnium, cyclopentadienyltris(dimethylamino)hafnium ($CpHf(NMe_2)_3$), methylcyclopentadienyltris(dimethylamino)hafnium ($MeCpHf(NMe_2)_3$), ethylcyclopentadienyltris(dimethylamino)hafnium ($EtCpHf(NMe_2)_3$), cyclopentadienyltris(dimethylamino)hafnium ($CpHf(NMe_2)_3$), methylcyclopentadienyltris(ethylmethylamino)hafnium ($MeCpHf(NMeEt)_3$), ethylcyclopentadienyltris(ethylmethylamino)hafnium ($EtCpHf(NMeEt)_3$), cyclopentadienyltris(diethylamino)hafnium ($CpHf(NEt_2)_3$), methylcyclopentadienyltris(diethylamino)hafnium ($MeCpHf(NEt_2)_3$), ethylcyclopentadienyltris(diethylamino)hafnium ($EtCpHf(NEt_2)_3$), bis(cyclopentadienyl)bis(dimethylamino)hafnium ($Cp_2Hf(NMe_2)_2$) bis(methylcyclopentadienyl)bis(dimethylamino)hafnium ($(MeCp)_2Hf(NMe_2)_2$) bis(ethylcyclopentadienyl)bis(dimethylamino)hafnium ($(EtCp)_2Hf(NMe_2)_2$) bis(cyclopentadienyl)bis(ethylmethylamino)hafnium ($Cp_2Hf(NMeEt)_2$) bis(methylcyclopentadienyl)bis(ethylmethylamino)hafnium ($(MeCp)_2Hf(NMeEt)_2$) bis(ethylcyclopentadienyl)bis(ethylmethylamino)hafnium ($(EtCp)_2Hf(NMeEt)_2$), bis(cyclopentadienyl)bis(diethylamino)hafnium ($(Cp_2Hf(NEt_2)_2)$), bis(methylcyclopentadienyl)bis(diethylamino)hafnium ($(MeCp)_2Hf(NEt_2)_3$), bis(ethylcyclopentadienyl)bis(diethylamino)hafnium ($(EtCp)_2Hf(NEt_2)_2$), (N-methyl-2,4-cyclopentadiene-1-ethanamino]bis(dimethylamino)hafnium, (N-ethyl-2,4-cyclopentadiene-1-ethanamino]bis(dimethylamino)hafnium, (N-methyl-2,4-cyclopentadiene-1-ethanamino]bis(diethylamino)hafnium, (N-ethyl-2,4-cyclopentadiene-1-ethanamino]bis(diethylamino) hafnium, (N-methyl-2,4-cyclopentadiene-1-ethanamino]bis(ethylmethylamino)hafnium, (N-ethyl-2,4-cyclopentadiene-1-ethanamino]bis(ethylmethylamino) hafnium, and combinations thereof.

Exemplary solvents can include, without limitation, ether, tertiary amine, alkyl hydrocarbon, aromatic hydrocarbon, siloxanes, tertiary aminoether, and combinations thereof.

The wt. % of organoaminosilane precursor compound in the formulation without solvent can vary from 0.10 to 99.90 wt. %; or 0.10 to 30.00 wt. %, 0.10 to 20.00 wt. %, 0.10 to 10.00 wt. %; or 5.00 to 30.00 wt. %, 5.00 to 20.00 wt. %, 5.00 to 10.00 wt. %, 0.10 to 5.00 wt. %.

The wt. % of organoaminosilane precursor compound in the formulation with the solvent can vary from 0.01 to 99.99 wt. %, or 10.00 to 90.00 wt. %, or 20.00 to 80.00 wt. %, or 30.00 to 70.00 wt. %, or 40.00 to 60.00 wt. %.

The wt. % of organoaminohafnium precursor compound in the formulation without solvent can vary from 0.10 to 99.00 wt. %; or 0.10 to 30.00 wt. %, 0.10 to 20.00 wt. %, 0.10 to 10.00 wt. %; or 5.00 to 30.00 wt. %, 5.00 to 20.00 wt. %, 5.00 to 10.00 wt. %, 0.10 to 5.00 wt. %.

The wt. % of organoaminohafnium compound in the formulation with the solvent can vary from 0.10 to 99.00 wt. %, or 10.00 to 90.00 wt. %, or 20.00 to 80.00 wt. %, or 30.00 to 70.00 wt. %, or 40.00 to 60.00 wt. %.

In another aspect, the present invention is also a silicon doped hafnium oxide film having a silicon doping level ranging from 0.50 to 8.00 mol %, preferably 2.00 to 6.00 mol %, most preferably 3.00 to 5.00 mol %, deposited using the disclosed compositions, methods and systems.

In yet another aspect, the present invention is also a ferroelectric material containing the silicon doped hafnium oxide film having a silicon doping level ranging from 0.50 to 8.00 mol %, preferably 2.00 to 6.00 mol %, most preferably 3.00 to 5.00 mol %; deposited using the disclosed compositions, methods and systems.

In some embodiments, the composition can be delivered via direct liquid injection into a reactor chamber for silicon-containing film.

The embodiments of the invention can be used alone or in combinations with each other.

DETAILED DESCRIPTION OF THE INVENTION

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The present invention can be practiced using equipment known in the art. For example, the inventive method can use a reactor that is conventional in the semiconductor manufacturing art.

Figure 1:
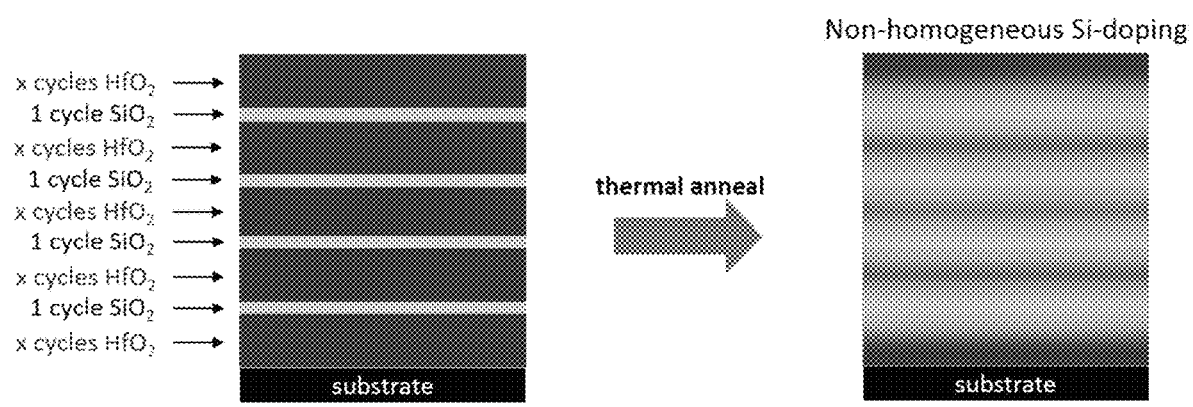
FIG. 1 provides a diagram depicting prior art methods to deposit silicon doped hafnium oxide using a so-called super cycle ALD process, resulting in nanolaminate structures, followed by thermal annealing to create silicon doped hafnium oxide suitable for ferroeletrical material (see "Impact of ALD processing on non-volatile memory performance of ferroelectric $HfO_2$ based capacitors" 16th International Conference on Atomic Layer Deposition. 24th -27th July 2016, Dublin, Ireland).
Figure 2:
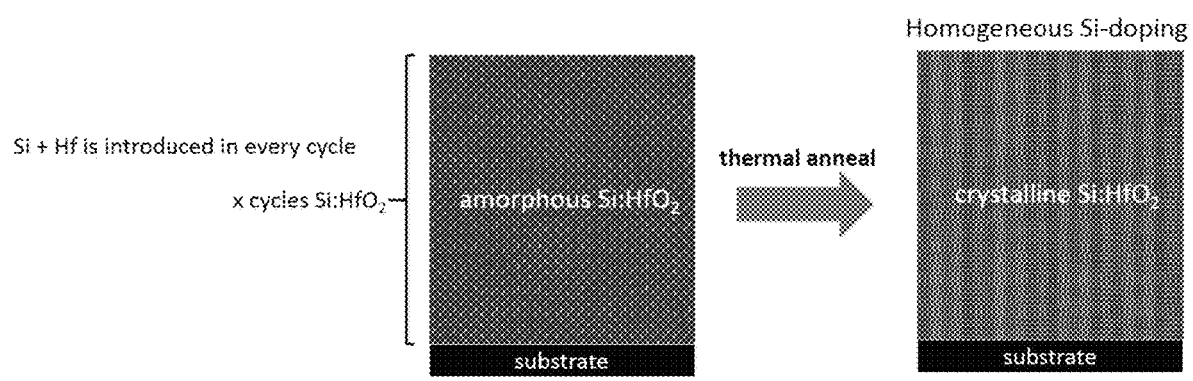
FIG. 2 provides a diagram depicting the current invention to deposit silicon doped hafnium oxide, resulting in homogeneous mixing of silicon and hafnium atoms in each cycle of ALD or PEALD process, followed by thermal annealing to create silicon doped hafnium oxide suitable for ferroeletrical material.

Atomic Layer Deposition (ALD) and Plasma Enhanced Atomic Layer Deposition (PEALD) are currently processes used to deposit silicon doped hafnium oxide employing super cycle approaches, i.e. many cycles of hafnium oxide followed by one or a few cycles of silicon oxide to control the amount of silicon dopant to provide ferroelectric material upon annealing the resulting nanolaminates to crystallize into orthorhombic phase as shown by FIG. 1. In both ALD and PEALD processes, the precursors and reactive gas (such as oxygen, oxygen plasma, ozone, or water) are separately pulsed in certain number of cycles to form a multiple layers of hafnium oxide and monolayer of silicon oxide at each super cycle. However, the silicon dopants may not homogenously distribute into the crystal lattice, which may be detrimental in the performance of ferroelectric materials in semiconductor applications. To remedy this, one possible solution is to co-deposit both silicon oxide and hafnium oxide at each ALD or PEALD cycle as demonstrated by FIG. 2, allowing better inter-mixing of silicon and hafnium atoms as well as creating Si—O—Hf or Hf—O—Si linkages, followed by thermal annealing to crystallize into proper orthorhombic phase suitable as ferroelectric material.

In some embodiments, an oxygen-containing source employed in the method is a source selected from the group consisting of an oxygen plasma, ozone, a water vapor, water vapor plasma, nitrogen oxide (e.g., $N_2O$, NO, $NO_2$) plasma with or without inert gas, a carbon oxide (e.g., $CO_2$, CO) plasma and combinations thereof. In certain embodiments, the oxygen source further comprises an inert gas. In these embodiments, the inert gas is selected from the group consisting of argon, helium, nitrogen, hydrogen, and combinations thereof. In an alternative embodiment, the oxygen source does not comprise an inert gas.

Without wishing to be bound by any theory or explanation, it is believed that the effectiveness of the inventive formulation can allow proper doping of silicon atoms into hafnium oxide via tuning the weight percentage of organoaminosilane precursor compound, in particular, the organoaminosilane precursor compound has the same organoamino group as the organoaminohafnium precursor compound allowing both precursors to be chemically compatible with each other but have different reactivity towards hydroxyl groups.

It is well known that hafnium oxide exists in three different crystal phases, monoclinic, tetragonal, and orthorhombic. Both monoclinic and tetragonal phases have been considered as high dielectric constant materials in the semiconductor industrials. The crystallization in thin films tends to proceed by nucleation in a tetragonal phase and a martensitic transformation to the monoclinic phase during crystal growth. This phase transformation involves volume expansion and shearing of the unit cell. The admixture of sufficient $SiO_2$ (between 5 and 10 mol %) has been found to stabilize the tetragonal phase in $HfO_2$. In addition, it was reported that also the presence of a top electrode during crystallization of $HfO_2$ thin films leads to a reduction of the monoclinic phase fraction and a significant increase in the dielectric constant. When silicon doping level is in the range of 2.00 to 6.00 mol %, the formation of the monoclinic phase is inhibited if crystallization occurs under mechanical encapsulation and an orthorhombic phase is obtained. This phase shows a distinct piezoelectical response, while polarization measurements exhibit a remanent polarization above 10 $\mu C/cm^2$ at a coercive field of 1 MV/cm, suggesting that this phase is ferroelectric. The formulation composition disclosed in this invention allows better homogenous silicon doping into hafnium oxide compared to those described in the Background of the Invention and, therefore, may provide an advantage in one or more aspects with respect to either cost or convenience of precursor synthesis, physical properties of the precursor including thermal stability, melting point, compatibility, reactivity or volatility, the process of depositing a silicon doped hafnium oxide, cost or convenience of precursor delivery, ability to control the level of silicon doping, reproducibility and uniformity of silicon doping, or importantly the properties of the deposited silicon doped hafnium oxide film suitable as ferroelectric material.

Without wishing to be bound by any theory or explanation, it is believed that the effectiveness of the inventive formulation can allow proper doping of silicon atoms into hafnium oxide via tuning the weight percentage of organoaminosilane precursor, in particular, the organoaminosilane precursor has the same organoamino group as the organoaminohafnium precursor allowing both precursors to be chemically compatible with each other, i.e. no compositional change during storage or use, but have different reactivity towards hydroxyl groups. The silicon doping in the hafnium oxide film may also be tuned based on varying reactivities of different compatible silicon and hafnium precursors. For example, a formulation comprising a less reactive organoaminosilane and a more reactive organoaminohafnium precursor may be used to achieve lower silicon doping levels in the silicon doped hafnium oxide film. Likewise, a formulation comprising a less reactive organoaminosilane and a more reactive organoaminohafnium precursor may be used to achieve higher silicon doping levels in the silicon doped hafnium oxide film. It is also believed that the silicon doping levels in the silicon doped hafnium oxide material can be tuned by varying the deposition temperature based on the varying reactivity of the organoaminosilane and organoaminohafnium components.

In one aspect, the composition for depositing a silicon doped hafnium oxide film as ferroelectric materials comprises:
(a) at least one organoaminosilane precursor compound having a formula of $R_xR^3Si(NR^1R^2)_{3-x}$; where R is selected from halide (Cl, Br, I) or a linear or branched $C_1$ to $C_6$ alkyl; $R^1$ and $R^2$ are independently selected from linear or branched $C_1$ to $C_6$ alkyl wherein $R^1$ and $R^2$ are linked to form a cyclic ring structure or $R^1$ and $R^2$ are not linked to form a cyclic ring structure; $R^3$ is selected from the group consisting of linear or branched $C_1$ to $C_6$ alkyl; x=0, 1, or 2; and (b) at least one organoaminohafnium precursor compound having a formula of $L_xHf(NR^1R^2)_{4-x}$ wherein L is selected from cyclopentadienyl or alkyl substituted cyclopentadienyl; $R^1$ and $R^2$ are independently selected from linear or branched $C_1$ to $C_6$ alkyl wherein $R^1$ and $R^2$ are linked to form a cyclic ring structure or $R^1$ and $R^2$ are not linked to form a cyclic ring structure, x=0, 1 or 2.

In yet another aspect, there is provided a method to deposit a silicon doped hafnium oxide film as ferroelectric materials onto a substrate comprising the steps of:
a) providing the substrate in a reactor;
b) introducing into the reactor a composition comprising:
(a) at least one organoaminosilane precursor compound having a formula of $R_xR^3Si(NR^1R^2)_{3-x}$; where R is selected from halide (Cl, Br, I) or a linear or branched $C_1$ to $C_6$ alkyl; $R^1$ and $R^2$ are independently selected from linear or branched $C_1$ to $C_6$ alkyl wherein $R^1$ and $R^2$ are linked to form a cyclic ring structure or $R^1$ and $R^2$ are not linked to form a cyclic ring structure; $R^3$ is selected from the group consisting of linear or branched $C_1$ to $C_6$ alkyl; x=0, 1, or 2; and (b) at least one organoaminohafnium precursor compound having a formula of $L_xHf(NR^1R^2)_{4-x}$ wherein L is selected from cyclopentadienyl or alkyl substituted cyclopentadienyl; $R^1$ and $R^2$ are independently selected from linear or branched $C_1$ to $C_6$ alkyl wherein $R^1$ and $R^2$ are linked to form a cyclic ring structure or $R^1$ and $R^2$ are not linked to form a cyclic ring structure, x=0, 1 or 2;
c) purging the reactor with a purge gas;
d) introducing an oxygen-containing source into the reactor; and
e) purging the reactor with the purge gas;
wherein the steps b) through e) are repeated until a desired thickness of film is deposited; and the method is conducted at a temperature ranging from about 100° C. to 600° C. In some embodiments, the oxygen-containing source in step d) is water because other oxygen-containing source such as ozone, oxygen plasma can potentially oxidize the substrate materials such as silicon or metal nitride.

In some embodiments of aforementioned methods, the examples of the composition comprising bis(dimethylamino)dimethylsilane and tetrakis(dimethylamino)hafnium include, but are not limited to, about 2.00 wt. % bis(dimethylamino)dimethylsilane, about 3.00 wt. % bis(dimethylamino)dimethylsilane, about 4.00 wt. % bis(dimethylamino)dimethylsilane, about 5.00 wt. % bis(dimethylamino)dimethylsilane, about 10.00 wt. % bis(dimethylamino)dimethylsilane, about 20.00 wt. % bis(dimethylamino)dimethylsilane, about 30.00 wt. % bis(dimethylamino)dimethylsilane, about 40.00 wt. % bis(dimethylamino)dimethylsilane, about 50.00 wt. % bis(dimethylamino)dimethylsilane, about 60.00 wt. % bis(dimethylamino)dimethylsilane, about 70.00 wt. % bis(dimethylamino)dimethylsilane, about 80.00 wt. % bis(dimethylamino)dimethylsilane, about 90.00 wt. % bis(dimethylamino)dimethylsilane.

In other embodiments of aforementioned methods, the examples of the composition comprising bis(ethylmethylamino)dimethylsilane and tetrakis(ethylmethylamino)hafnium include, but are not limited to, about 2.00 wt. % bis(ethylmethylamino)dimethylsilane, about 3.00 wt. % bis(ethylmethylamino)dimethylsilane, about 4.00 wt. % bis(ethylmethylamino)dimethylsilane, about 5.00 wt. % bis(ethylmethylamino)dimethylsilane, about 10.00 wt. % bis(ethylmethylamino)dimethylsilane, about 20.00 wt. % bis(ethylmethylamino)dimethylsilane, about 30.00 wt. % bis(ethylmethylamino)dimethylsilane, about 40.00 wt. % bis(ethylmethylamino)dimethylsilane, about 50.00 wt. % bis(ethylmethylamino)dimethylsilane, about 60.00 wt. % bis(ethylmethylamino)dimethylsilane, about 70.00 wt. % bis (ethylmethylamino)dimethylsilane, about 80.00 wt. % bis (ethylmethylamino)dimethylsilane, about 90.00 wt. % bis (ethylmethylamino)dimethylsilane.

In yet another aspect, there is provided a method to deposit a silicon doped hafnium oxide film onto a substrate comprising the steps of:
- a) providing the substrate in a reactor;
- b) introducing at least one hafnium precursor compound having a formula of $L_xHf(NR^1R^2)_{4-x}$ wherein L is selected from cyclopentadienyl or alkyl substituted cyclopentadienyl; $R^1$ and $R^2$ are independently selected from linear or branched $C_1$ to $C_6$ alkyl, x=0, 1, or 2;
- c) purging the reactor with a purge gas;
- d) introducing an oxygen-containing source into the reactor; and
- e) purging the reactor with the purge gas;
- f) introducing into the reactor a composition comprising: (a) at least one organoaminosilane precursor compound having a formula of $R_xR^3Si(NR^1R^2)_{3-x}$; where R is selected from halide (Cl, Br, I) or a linear or branched $C_1$ to $C_6$ alkyl; $R^1$ and $R^2$ are independently selected from linear or branched $C_1$ to $C_6$ alkyl wherein $R^1$ and $R^2$ are linked to form a cyclic ring structure or $R^1$ and $R^2$ are not linked to form a cyclic ring structure; $R^3$ is selected from the group consisting of linear or branched $C_1$ to $C_6$ alkyl; x=0, 1, or 2; and (b) at least one organoaminohafnium precursor compound having a formula of $L_xHf(NR^1R^2)_{4-x}$ wherein L is selected from cyclopentadienyl or alkyl substituted cyclopentadienyl; $R^1$ and $R^2$ are independently selected from linear or branched $C_1$ to $C_6$ alkyl wherein $R^1$ and $R^2$ are linked to form a cyclic ring structure or $R^1$ and $R^2$ are not linked to form a cyclic ring structure, x=0, 1 or 2;
- g) purging the reactor with a purge gas;
- h) introducing an oxygen-containing source into the reactor; and
- i) purging the reactor with the purge gas;
- wherein the steps b) through e) are repeated until a desired thickness of film is deposited; and the method is conducted at a temperature ranging from about 100° C. to 600° C. In some embodiments, the oxygen-containing source in step d) is water, in other embodiments, the oxygen-containing source in step d) and h) are both water because other oxygen-containing source such as ozone, oxygen plasma can potentially oxidize the substrate materials such as silicon or metal nitride.

In yet another aspect, there is provided a system to deposit a silicon doped hafnium oxide film onto a substrate comprising:
the substrate in a reactor;
a composition comprising:
(a) at least one organoaminosilane precursor compound having a formula of $R_xR^3Si(NR^1R^2)_{3-x}$; where R is selected from halide (Cl, Br, I) or a linear or branched $C_1$ to $C_6$ alkyl; $R^1$ and $R^2$ are independently selected from linear or branched $C_1$ to $C_6$ alkyl wherein $R^1$ and $R^2$ are linked to form a cyclic ring structure or $R^1$ and $R^2$ are not linked to form a cyclic ring structure; $R^3$ is selected from the group consisting of linear or branched $C_1$ to $C_6$ alkyl; x=0, 1, or 2; and (b) at least one organoaminohafnium precursor compound having a formula of $L_xHf(NR^1R^2)_{4-x}$ wherein L is selected from cyclopentadienyl or alkyl substituted cyclopentadienyl; $R^1$ and $R^2$ are independently selected from linear or branched $C_1$ to $C_6$ alkyl wherein $R^1$ and $R^2$ are linked to form a cyclic ring structure or $R^1$ and $R^2$ are not linked to form a cyclic ring structure, x=0, 1 or 2;
and the system is at a temperature ranging from 100° C. to 600° C.

In another aspect, the composition for depositing a silicon doped hafnium oxide film further comprises: (c) a solvent.

In one aspect, the present invention is also a vessel or container employing at least one precursor compound or at least one precursor compound with a solvent; where the at least one precursor compound is selected from the group consisting of (a) at least one organoaminosilane precursor compound having a formula of $R_xR^3Si(NR^1R^2)_{3-x}$; where R is selected from halide (Cl, Br, I) or a linear or branched $C_1$ to $C_6$ alkyl; $R^1$ and $R^2$ are independently selected from linear or branched $C_1$ to $C_6$ alkyl wherein $R^1$ and $R^2$ are linked to form a cyclic ring structure or $R^1$ and $R^2$ are not linked to form a cyclic ring structure; $R^3$ is selected from the group consisting of linear or branched $C_1$ to $C_6$ alkyl; x=0, 1, or 2; and (b) at least one organoaminohafnium precursor compound having a formula of $L_xHf(NR^1R^2)_{4-x}$ wherein L is selected from cyclopentadienyl or alkyl substituted cyclopentadienyl; $R^1$ and $R^2$ are independently selected from linear or branched $C_1$ to $C_6$ alkyl wherein $R^1$ and $R^2$ are linked to form a cyclic ring structure or $R^1$ and $R^2$ are not linked to form a cyclic ring structure, x=0, 1 or 2.

Examples of suitable organoaminosilane precursors that may be used with the method disclosed herein include, but are not limited to tris(dimethylamino)methylsilane, tris(diethylamino)methylsilane, tris(ethylmethylamino)methylsilane, tris(pyrrolidino)methylsilane, tris(dimethylamino)ethylsilane, tris(diethylamino)ethylsilane, tris(ethylmethylamino)ethylsilane, tris(pyrrolidino)ethylsilane, bis(dimethylamino)dimethylsilane, bis(diethylamino)dimethylsilane, bis(ethylmethylamino)dimethylsilane, bis(pyrrolidino)dimethylsilane, bis(dimethylamino)diethylsilane, bis(diethylamino)diethylsilane, bis(ethylmethylamino)diethylsilane, bis(pyrrolidino)diethylsilane, dimethylaminotrimethylsilane, diethylaminotrimethylsilane, ethylmethylaminotrimethylsilane, pyrrolidinotrimethylsilane, dimethylaminotriethylsilane, diethylaminotriethylsilane, ethylmethylaminotriethylsilane, pyrrolidinotriethylsilane, dimethylaminophenyldimethylsilane, diethylaminophenyldimethylsilane, ethylmethylaminophenyldimethylsilane, pyrrolidinophenyldimethylsilane, tris(dimethylamino)phenylsilane, tris(diethylamino)phenylsilane, tris(ethylmethylamino)phenylsilane, tris(pyrrolidino)phenylsilane, 1-dimethylamino-1,1,3,3,3-pentamethyldisiloxane, 1,1,1,4,4,4-hexakis(dimethylamino)-1,4-disilabutane, 2,5-bis(dimethylamino)-2,5-dimethyl-2,5-disilahexane and combinations thereof.

Examples of suitable organoaminohafnium precursors that may be used with the method disclosed herein include, but are not limited to tetrakis(dimethylamino)hafnium (TDMAH), tetrakis(diethylamino)hafnium (TDEAH), tetrakis(ethylmethylamino)hafnium (TEMAH), tetrakis(pyrrolidino)hafnium, cyclopentadienyltris(dimethylamino)hafnium (CpHf(NMe$_2$)$_3$), methylcyclopentadienyltris(dimethylamino)hafnium (MeCpHf(NMe$_2$)$_3$), ethylcyclopentadienyltris(dimethylamino)hafnium (EtCpHf(NMe$_2$)$_3$), cyclopentadienyltris(dimethylamino)hafnium (CpHf(NMe$_2$)$_3$), methylcyclopentadienyltris(ethylmethylamino)hafnium (MeCpHf(NMeEt)$_3$), ethylcyclopentadienyltris(ethylmethylamino)hafnium (EtCpHf(NMeEt)$_3$), cyclopentadienyltris(diethylamino)hafnium (CpHf(NEt$_2$)$_3$), methylcyclopentadienyltris(diethylamino)hafnium (MeCpHf(NEt$_2$)$_3$), ethylcyclopentadienyltris(diethylamino)hafnium (EtCpHf(NEt$_2$)$_3$), bis(cyclopentadienyl)bis(dimethylamino)hafnium (Cp$_2$Hf(NMe$_2$)$_2$) bis(methylcyclopentadienyl)bis(dimethylamino)hafnium ((MeCp)$_2$Hf(NMe$_2$)$_2$) bis(ethylcyclopentadienyl)bis(dimethylamino)hafnium ((EtCp)$_2$Hf(NMe$_2$)$_2$) bis(cyclopentadienyl)bis(ethylmethylamino)hafnium (Cp$_2$Hf(NMeEt)$_2$) bis(methylcyclopentadienyl)bis(ethylmethyl0amino)hafnium ((MeCp)$_2$Hf(NMeEt)$_2$) bis(ethylcyclopentadienyl)bis(ethylmethylamino)hafnium ((EtCp)$_2$Hf(NMeEt)$_2$), bis(cyclopentadienyl)bis(diethylamino)hafnium ((Cp$_2$Hf(NEt$_2$)$_2$), bis(methylcyclopentadienyl)bis(diethylamino)hafnium ((MeCp)$_2$Hf(NEt$_2$)$_3$), bis(ethylcyclopentadienyl)bis(diethylamino)hafnium ((EtCp)$_2$Hf(NEt$_2$)$_2$), (N-methyl-2,4-cyclopentadiene-1-ethanamino]bis(dimethylamino)hafnium, (N-ethyl-2,4-cyclopentadiene-1-ethanamino]bis(dimethylamino)hafnium, (N-methyl-2,4-cyclopentadiene-1-ethanamino]bis(diethylamino)hafnium, (N-ethyl-2,4-cyclopentadiene-1-ethanamino]bis(diethylamino) hafnium, (N-methyl-2,4-cyclopentadiene-1-ethanamino]bis(ethylmethylamino)hafnium, (N-ethyl-2,4-cyclopentadiene-1-ethanamino]bis(ethylmethylamino) hafnium, and combinations thereof.

In certain embodiments of the composition described herein, exemplary solvents can include, without limitation, ether, tertiary amine, alkyl hydrocarbon, aromatic hydrocarbon, siloxanes, tertiary aminoether, and combinations thereof.

The wt. % of organoaminosilane precursor compound in the formulation without solvent can vary from 0.10 to 99.90 wt. %; or 0.10 to 30.00 wt. %, 0.10 to 20.00 wt. %, 0.10 to 10.00 wt. %; or 5.00 to 30.00 wt. %, 5.00 to 20.00 wt. %, 5.00 to 10.00 wt. %, 0.10 to 5.00 wt. %.

The wt. % of organoaminosilane precursor compound in the formulation with the solvent can vary from 0.10 to 99.90 wt. %, or 10.00 to 90.00 wt. %, or 20.00 to 80.00 wt. %, or 30.00 to 70.00 wt. %, or 40.00 to 60.00 wt. %.

The wt. % of organoaminohafnium precursor compound in the formulation without solvent can vary from 0.10 to 99.90 wt. %; or 0.10 to 30.00 wt. %, 0.10 to 20.00 wt. %, 0.10 to 10.00 wt. %; or 5.00 to 30.00 wt. %, 5.00 to 20.00 wt. %, 5.00 to 10.00 wt. %, 0.10 to 5.00 wt. %.

The wt. % of organoaminohafnium precursor compound in the formulation with the solvent can vary from 0.10 to 99.90 wt. %, or 10.00 to 90.00 wt. %, or 20.00 to 80.00 wt. %, or 30.00 to 70.00 wt. %, or 40.00 to 60.00 wt. %.

In another aspect, the present invention is also a silicon doped hafnium oxide film having a silicon doping level ranging from 0.50 to 8.00 mol %, preferably 2.00 to 6.00 mol %, most preferably 2.00 to 5.00 mol %, deposited using the disclosed compositions, methods and systems. In some embodiments, the ferroelectric material comprises hafnium, silicon, and oxygen; In other embodiments, the ferroelectric material comprises hafnium, silicon, oxygen, and carbon. The content of carbon can be less than about 1.00 at. % or less, about 0.50 at. % or less, about 0.10 at. % or less, about 0.01 at. % or less; Yet in another embodiment, the ferroelectric material comprises hafnium, silicon, oxygen, carbon, and nitrogen. The content of carbon can be less than about 1.00 at. % or less, about 0.50 at. % or less, about 0.10 at. % or less, about 0.01 at. % or less and the content of nitrogen can be less than about 1.00 at. % or less, about 0.50 at. % or less, about 0.10 at. % or less, about 0.01 at. % or less.

In yet another aspect, the present invention is also a ferroelectric material containing the silicon doped hafnium oxide film having a silicon doping level ranging from 0.50 to 8.00 mol %, preferably 2.00 to 6.00 mol %, most preferably 3.00 to 5.00 mol %, deposited using the disclosed compositions, methods and systems.

In some embodiments, the composition can be delivered via direct liquid injection into a reactor chamber for silicon-containing film.

The embodiments of the invention can be used alone or in combinations with each other.

Throughout the description, "silicon doping level" is defined as (Si at. %)/(Si at. %+Hf at. %), that is, the atomic Si percentage divided by the sum of atomic Si and atomic Hf percentages as measured by XPS (X-ray Photoelectron Spectroscopy). For example, a 3 mol % silicon doping level in a silicon doped hafnium oxide film means that 3 out of 100 Hf atoms in a hafnium oxide material have been substituted by silicon atoms, such that the Si:Hf molar ratio in the silicon doped hafnium oxide film is 3:97 (3/(3+97)=3 mol % silicon doping level). In this example, a 3 mol % silicon doping level in HfO$_2$ equates to an overall Si content of 1.0 at. % as measured by XPS. Thus, 0.5 to 8 mol % silicon doping level corresponds to 0.17 at. % to 2.67 at. % as measured by XPS, 2 to 6 mol % silicon doping level corresponds to 0.67 at. % to 2.00 at. % as measured by XPS. The silicon doping level can have up to two decimal points, for example, 2 out of 99 Hf atoms in a hafnium oxide material have been substituted by silicon atoms, the silicon doping level is defined as 2.02 mol %.

Throughout the description, "wt. %" is defined as weight of organoaminosilane precursors/(weight of organoaminosilane precursors+weight of organoaminohafnium precursors) or weight of organoaminosilane precursors/(weight of organoaminosilane precursors+weight of organoaminohafnium precursors+weight of solvent). The wt. % can have up to two decimal points, that is the range of 0.10 to 5.00 wt. % covers any weight percentage from 0.10 to 5.00 wt. % with two decimal points.

Throughout the description, the word "about" is used before a value for percentage or temperature to indicate the value can have up to 10% error bar, for example about 10.00 wt. % covers the weight percentage from 9.00 wt. % to 11.00 wt. %. Likewise, about 2.00 wt % covers any percentage from 1.80 to 2.20 wt. %.

In the formula above and throughout the description, the term "alkyl" denotes a linear or branched functional group having from 1 to 10 carbon atoms. Exemplary linear alkyl groups include, but are not limited to, methyl, ethyl, propyl, butyl, pentyl, and hexyl groups. Exemplary branched alkyl groups include, but are not limited to, iso-propyl, iso-butyl, sec-butyl, tert-butyl, iso-pentyl, tert-pentyl, iso-hexyl, and neo-hexyl. In certain embodiments, the alkyl group may have one or more functional groups attached thereto such as, but not limited to, an alkoxy group, a dialkylamino group or combinations thereof, attached thereto. In other embodiments, the alkyl group does not have one or more functional groups attached thereto. The alkyl group may be saturated or, alternatively, unsaturated.

Throughout the description, the term "alkyl hydrocarbon" refers to a linear or branched $C_1$ to $C_{20}$ hydrocarbon, cyclic $C_6$ to $C_{20}$ hydrocarbon. Exemplary hydrocarbon includes, but is not limited to, hexane, heptane, octane, nonane, decane, dodecane, cyclooctane, cyclononane, cyclodecane, ethylcyclohexane, ethylcyclooctane.

Throughout the description, the term "aromatic hydrocarbon" refers to a $C_6$ to $C_{20}$ aromatic hydrocarbon. Exemplary aromatic hydrocarbon n includes, but not limited to, toluene, mesitylene.

In certain embodiments, substituents $R^1$ and $R^2$ in the formula can be linked together to form a ring structure. As the skilled person will understand, where $R^1$ and $R^2$ are linked together to form a ring. In these embodiments, the ring structure can be unsaturated such as, for example, a cyclic alkyl ring, or saturated, for example, an aryl ring. Further, in these embodiments, the ring structure can also be substituted or unsubstituted with one or more atoms or groups. Exemplary cyclic ring groups include, but not limited to, pyrrolidino, piperidino, and 2, 6-dimethylpiperidino groups. In other embodiments, however, substituent $R^1$ and $R^2$ are not linked to form a ring structure.

Throughout the description, the term "organoamino group" refers to $R^1R^2N$— wherein $R^1$ and $R^2$ are independently selected from linear or branched $C_1$ to $C_6$ alkyl. In some cases, $R^1$ and $R^2$ are linked to form a cyclic ring structure, in other cases $R^1$ and $R^2$ are not linked to form a cyclic ring structure. Exemplary organoamino groups wherein $R^1$ and $R^2$ are not linked to form a cyclic ring includes, but are not limited to, dimethylamino, ethylmethylamino, diethylamino. Exemplary organoamino groups wherein $R^1$ and $R^2$ are linked to form a cyclic ring includes, but are not limited to, pyrrolidino wherein $R^1$=propyl and $R^2$=Me, piperidino wherein $R^1$=propyl and $R^2$=Et, 2, 6-dimethylpiperidino wherein $R^1$=iso-propyl and $R^2$=sec-butyl, and 2, 5-dimethylpyrrolidinodilane wherein $R^1$=$R^2$=iso-propyl.

Throughout the description, the term "alkyl substituted cyclopentadienyl" refers to a linear or branched $C_1$ to $C_6$ hydrocarbon bonded to cyclopentadienyl. Exemplary alkyl substituted cyclopentadienyl groups includes, but is not limited to, methylcyclopentadienyl, ethylcyclopentadienyl, iso-propylcyclopentadienyl, sec-butylcyclopentadienyl, and tert-butylcyclopentadienyl. In some particular embodiments, the alkyl group has nitrogen atom which can coordinated to hafnium. Exemplary such as alkyls include, but not limited to N-methyl-2,4-cyclopentadiene-1-ethanamine, N-ethyl-2,4-Cyclopentadiene-1-ethanamine. Organoaminohafnium having such alkyl substituted cyclopentadienyl groups include, but not limited to, (N-methyl-2,4-cyclopentadiene-1-ethanamino]bis(dimethylamino)hafnium, (N-ethyl-2, 4-cyclopentadiene-1-ethanamino]bis(dimethylamino)hafnium, (N-methyl-2,4-cyclopentadiene-1-ethanamino]bis(diethylamino)hafnium, (N-ethyl-2,4-cyclopentadiene-1-ethanamino]bis(diethylamino)hafnium, (N-methyl-2,4-cyclopentadiene-1-ethanamino]bis(ethylmethylamino) hafnium, (N-ethyl-2,4-cyclopentadiene-1-ethanamino]bis(ethylmethylamino)hafnium.

Throughout the description, the terms "composition" or "formulation" are interchangeable. The composition is selected from the group consisting of the following:

(1) (a) at least one organoaminosilane precursor compound having a formula of $R_xR^3Si(NR^1R^2)_{3-x}$; where R is selected from halide (Cl, Br, I) or a linear or branched $C_1$ to $C_6$ alkyl; $R^1$ and $R^2$ are independently selected from linear or branched $C_1$ to $C_6$ alkyl wherein $R^1$ and $R^2$ are linked to form a cyclic ring structure or $R^1$ and $R^2$ are not linked to form a cyclic ring structure; $R^3$ is selected from the group consisting of linear or branched $C_1$ to $C_6$ alkyl; x=0, 1, or 2; and (b) at least one organoaminohafnium precursor compound having a formula of $L_xHf(NR^1R^2)_{4-x}$ wherein L is selected from cyclopentadienyl or alkyl substituted cyclopentadienyl; $R^1$ and $R^2$ are independently selected from linear or branched $C_1$ to $C_6$ alkyl wherein $R^1$ and $R^2$ are linked to form a cyclic ring structure or $R^1$ and $R^2$ are not linked to form a cyclic ring structure, x=0, 1 or 2; and (2) (a) at least one organoaminosilane precursor compound having a formula of $R_xR^3Si(NR^1R^2)_{3-x}$; where R is selected from halide (Cl, Br, I) or a linear or branched $C_1$ to $C_6$ alkyl; $R^1$ and $R^2$ are independently selected from linear or branched $C_1$ to $C_6$ alkyl wherein $R^1$ and $R^2$ are linked to form a cyclic ring structure or $R^1$ and $R^2$ are not linked to form a cyclic ring structure; $R^3$ is selected from the group consisting of linear or branched $C_1$ to $C_6$ alkyl; x=0, 1, or 2; and (b) at least one organoaminohafnium precursor compound having a formula of $L_xHf(NR^1R^2)_{4-x}$ wherein L is selected from cyclopentadienyl or alkyl substituted cyclopentadienyl; $R^1$ and $R^2$ are independently selected from linear or branched $C_1$ to $C_6$ alkyl wherein $R^1$ and $R^2$ are linked to form a cyclic ring structure or $R^1$ and $R^2$ are not linked to form a cyclic ring structure, x=0, 1 or 2; and (c) a solvent.

In one or more embodiments described above, the oxygen-containing source is a source selected from the group consisting of an oxygen plasma, ozone, a water vapor, water vapor plasma, nitrogen oxide (e.g., $N_2O$, NO, $NO_2$) plasma with or without inert gas, a carbon oxide (e.g., $CO_2$, CO) plasma and combinations thereof.

In certain embodiments, the oxygen-containing source further comprises an inert gas. In these embodiments, the inert gas is selected from the group consisting of argon, helium, nitrogen, hydrogen, and combinations thereof.

In an alternative embodiment, the oxygen-containing source does not comprise an inert gas.

Throughout the description, the term "ALD or ALD-like" refers to a process including, but is not limited to, the following processes: a) each reactant including a silicon precursor and a reactive gas is introduced sequentially into a reactor such as a single wafer ALD reactor, semi-batch ALD reactor, or batch furnace ALD reactor; b) each reactant including the silicon precursor and the reactive gas is exposed to a substrate by moving or rotating the substrate to different sections of the reactor and each section is separated by inert gas curtain, i.e., spatial ALD reactor or roll to roll ALD reactor. A typical cycle of an ALD or ALD-like process comprises at least four steps as aforementioned.

In certain embodiments, silicon doped hafnium oxide films deposited using the methods described herein are formed in the presence of oxygen-containing source comprising ozone, water ($H_2O$) (e.g., deionized water, purifier water, and/or distilled water), oxygen ($O_2$), oxygen plasma, NO, $N_2O$, $NO_2$, carbon monoxide (CO), carbon dioxide ($CO_2$) and combinations thereof.

The oxygen-containing source is passed through, for example, either an in situ or remote plasma generator to provide oxygen-containing plasma source comprising oxygen such as an oxygen plasma, a plasma comprising oxygen and argon, a plasma comprising oxygen and helium, an ozone plasma, a water plasma, a nitrous oxide plasma, or a carbon dioxide plasma.

In certain embodiments, the oxygen-containing source comprises an oxygen source gas that is introduced into the reactor at a flow rate ranging from about 1 to about 2000 standard cubic centimeter per minute (sccm) or from about 1 to about 1000 sccm.

The oxygen-containing source can be introduced for a time that ranges from about 0.1 to about 100 seconds.

In one particular embodiment, the oxygen-containing source comprises water having a temperature of 10° C. or greater.

In embodiments wherein the film is deposited by a PEALD or a plasma enhanced cyclic CVD process, the precursor pulse can have a pulse duration that is greater than 0.01 seconds (e.g., about 0.01 to about 0.1 seconds, about 0.1 to about 0.5 seconds, about 0.5 to about 10 seconds, about 0.5 to about 20 seconds, about 1 to about 100 seconds)

depending on the ALD reactor's volume, and the oxygen-containing source can have a pulse duration that is less than 0.01 seconds (e.g., about 0.001 to about 0.01 seconds).

The deposition methods disclosed herein may involve one or more purge gases. The purge gas, which is used to purge away unconsumed reactants and/or reaction byproducts, is an inert gas that does not react with the precursors.

Exemplary purge gases include, but are not limited to, argon (Ar), nitrogen ($N_2$), helium (He), neon, hydrogen ($H_2$), and mixtures thereof. In certain embodiments, a purge gas such as Ar is supplied into the reactor at a flow rate ranging from about 10 to about 2000 sccm for about 0.1 to 1000 seconds, thereby purging the unreacted material and any byproduct that may remain in the reactor.

The respective step of supplying the precursors, oxygen source, and/or other precursors, source gases, and/or reagents may be performed by changing the time for supplying them to change the stoichiometric composition of the resulting dielectric film.

Energy is applied to at least one of the silicon precursors/ formula, oxygen containing source, or combination thereof to induce reaction and to form the silicon doped hafnium oxide on the substrate and then to convert the resulting film into orthorhombic form suitable as ferroelectric material.

Such energy can be provided by, but not limited to, thermal, plasma, pulsed plasma, helicon plasma, high density plasma, inductively coupled plasma, X-ray, e-beam, photon, remote plasma methods, and combinations thereof. Thermal annealing can be done at temperatures up to 1000° C.

In certain embodiments, a secondary RF frequency source can be used to modify the plasma characteristics at the substrate surface.

In embodiments wherein the deposition involves plasma, the plasma-generated process may comprise a direct plasma-generated process in which plasma is directly generated in the reactor, or alternatively, a remote plasma-generated process in which plasma is generated outside of the reactor and supplied into the reactor.

The at least one formulation may be delivered to the reaction chamber such as a plasma enhanced cyclic CVD or PEALD reactor or a batch furnace type reactor in a variety of ways.

In one embodiment, a liquid delivery system may be utilized.

In another embodiment, a vessel or container employing a composition comprising at least one organoaminosilane precursor compound, and/or at least one organoaminohafnium precursor compound, and/or solvent for depositing a silicon doped hafnium oxide is described herein.

In one particular embodiment, the vessel or container (vessel and container are exchangeable) comprises at least one pressurizable vessel (preferably of stainless steel) fitted with the proper valves and fittings to allow the delivery of one or more precursors to the reactor for deposition process, such as a CVD or an ALD process. In this or other embodiments, the composition comprising at least one organoaminosilane precursor compound and at least one organoaminohafnium precursor compound is provided in a pressurizable vessel comprised of stainless steel and the purity of the precursor is 98% by weight or greater or 99.5% or greater which is suitable for the majority of semiconductor applications, as well as at least one inert gas selected from the group consisting of argon (Ar), nitrogen ($N_2$), helium (He), neon, and combinations thereof.

In certain embodiments, such vessels can also have means for mixing the precursors with one or more additional precursor if desired. In these or other embodiments, the contents of the vessel(s) can be premixed with an additional precursor.

In certain embodiments, the gas lines connecting from the composition canisters to the reaction chamber are heated to one or more temperatures depending upon the process requirements and the container of the composition described herein is kept at one or more temperatures for bubbling. In other embodiments, a composition comprising the at least one organoaminosilane precursor compound and at least one organoaminohafnium precursor compound described herein is injected into a vaporizer kept at one or more temperatures for direct liquid injection.

In an alternative embodiment, a combined liquid delivery and flash vaporization process unit may be employed, such as, for example, the turbo vaporizer manufactured by MSP Corporation of Shoreview, Minn., to enable low volatility materials to be volumetrically delivered, which leads to reproducible transport and deposition without thermal decomposition of the precursor.

In liquid delivery formulations, the precursors described herein may be delivered in neat liquid form, or alternatively, may be employed in solvent formulations or compositions comprising same. Thus, in certain embodiments the precursor formulations may include solvent component(s) of suitable character as may be desirable and advantageous in a given end use application to form a film on a substrate.

As previously mentioned, the purity level of the at least one organoaminosilane or organoaminohafnium precursor compound in the formulation is sufficiently high enough to be acceptable for reliable semiconductor manufacturing. In certain embodiments, the at least one organoaminosilane precursor compound described herein comprises less than 2% by weight, or less than 1% by weight, or less than 0.5% by weight of one or more of the following impurities: free amines, free halides or halogen ions, and higher molecular weight species. Higher purity levels of the silicon precursor described herein can be obtained through one or more of the following processes: purification, adsorption, and/or distillation.

The organoaminosilane or organoaminohafnium precursor compounds, and/or compositions comprising the organoaminosilane or organoaminohafnium precursor compounds according to the present invention are preferably substantially free of halide ions. As used herein, the term "substantially free" as it relates to halide ions (or halides) such as, for example, chlorides and fluorides, bromides, and iodides, means less than 5 ppm (by weight), preferably less than 3 ppm, and more preferably less than 1 ppm, and most preferably 0 ppm. Chlorides are known to act as decomposition catalysts for organoaminosilanes. Significant levels of chloride in the final product can cause the organoaminosilane precursor compound to degrade. The gradual degradation of the organoaminosilane may directly impact the film deposition process making it difficult for the semiconductor manufacturer to meet film specifications. In addition, the shelf-life or stability is negatively impacted by the higher degradation rate of the formulation thereby making it difficult to guarantee a 1-2 year shelf-life.

In one embodiment of the method described herein, a plasma enhanced cyclic deposition process such as PEALD-like or PEALD may be used wherein the deposition is conducted using the at least one organoaminosilane precursor compound and an oxygen containing source. The PEALD-like process is defined as a plasma enhanced cyclic CVD process but still provides high conformal hafnium-, silicon-, and oxygen-containing films.

In certain embodiments, the gas lines connecting from the precursor canisters to the reaction chamber are heated to one or more temperatures depending upon the process requirements and the container of the at least one formulation comprising at least one organoaminosilane and/or the at least one organoaminohafnium precursor compound is kept at room temperature for direct liquid injection (DLI). In other embodiments, a formulation comprising at least one organoaminosilane and/or the at least one organoaminohafnium precursor compound is injected into a vaporizer kept at one or more temperatures ranging from room temperature to about 60° C. for direct liquid injection.

A flow of argon and/or other gas may be employed as a carrier gas to help deliver the vapor of at least one formulation comprising at least one organoaminosilane and/or at least one organoaminohafnium precursor compound to the reaction chamber during the precursor pulsing.

In certain embodiments, the reaction chamber process pressure is about 50 mTorr to 10 Torr. In other embodiments, the reaction chamber process pressure can be up to 760 Torr (e.g., about 50 mTorr to about 100 Torr).

In a typical PEALD or a PEALD-like process such as a PECCVD process, the substrate such as a silicon oxide substrate is heated on a heater stage in a reaction chamber that is exposed to the organoaminosilane compound and/or organoaminohafnium precursor compound initially to allow the complex(es) to chemically adsorb onto the surface of the substrate.

A purge gas such as argon purges away unabsorbed excess complex from the process chamber. After sufficient purging, an oxygen source may be introduced into reaction chamber to react with the absorbed surface followed by another gas purge to remove reaction by-products from the chamber. The process cycle can be repeated to achieve the desired film thickness. In some cases, pumping can replace a purge with inert gas or both can be employed to remove unreacted silicon precursors.

In this or other embodiments, it is understood that the steps of the methods described herein may be performed in a variety of orders, may be performed sequentially, may be performed concurrently (e.g., during at least a portion of another step), and any combination thereof. The respective step of supplying the precursors and the oxygen source gases, for example, may be performed by varying the duration of the time for supplying them to change the stoichiometric composition of the resulting dielectric film. Also, purge times after precursor or oxidant steps can be minimized to <0.1 s so that throughput is improved.

Various commercial ALD reactors such as single wafer, semi-batch, batch furnace or roll to roll reactor can be employed for depositing the silicon doped hafnium oxide.

Process temperature for the method described herein use one or more of the following temperatures as endpoints: 100° C., 125° C., 150° C., 175° C., 200° C., 225° C., 250° C., 275° C., 300° C., 325° C., 350° C., 375° C., 400° C., 425° C., 450° C., 500° C., 525° C., 550° C.; preferably 200° C., 225° C., 250° C., 275° C., 300° C.

Exemplary temperature ranges include, but are not limited to the following: from about 200° C. to about 300° C.; or from about 100° C. to about 300° C.; or from about 150° C. to about 290° C.; or from about 125° C. to about 280° C., or from about 250° C. to about 300° C.

In a still further embodiment of the method described herein, the film or the as-deposited film deposited from ALD, ALD-like, PEALD, or PEALD-like is subjected to a treatment step (post deposition) to convert into crystal phase suitable for ferroelectric materials. The treatment step can be conducted during at least a portion of the deposition step, after the deposition step, and combinations thereof.

Exemplary post-treatment steps include, without limitation, treatment via high temperature thermal annealing such as rapid thermal annealing (RTA) or flash lamp annealing (FLA) at temperatures from 500 to 1000° C., or from 600 to 900° C., or from 600 to 800° C. to convert the as-deposited silicon doped hafnium oxide into orthorhombic phase. The thermal treatment can be performed via one step or multi-steps. Other post-treatment such as plasma treatment; ultraviolet (UV) light treatment; laser; electron beam treatment and combinations can also be employed thereof to affect one or more properties of the film.

In one particular embodiment, during the deposition process, as-deposited films are intermittently treated. These intermittent or mid-deposition treatments can be performed, for example, after each ALD cycle, after every certain number of ALD cycles, such as, without limitation, one (1) ALD cycle, two (2) ALD cycles, five (5) ALD cycles, or after every ten (10) or more ALD cycles. The thickness of the resulting silicon doped hafnium oxide ranges from 10 Å to 500 Å, or 30 Å to 400 Å, or 40 Å to 200 Å, or 40 Å to 100 Å, or 40 Å to 80 Å.

As mentioned previously, the method described herein may be used to deposit a silicon doped hafnium oxide film on at least a portion of a substrate. Examples of suitable substrates include but are not limited to, silicon, $SiO_2$, titanium nitride, tungsten nitride, tantalum nitride, vanadium nitride, metals such as copper, titanium, tungsten, cobalt, ruthenium, platinum palladium, aluminum and any other suitable electrode materials in the fabrication of ferroelectric devices.

The films are compatible with a variety of subsequent processing steps such as, for example, chemical mechanical planarization (CMP) and anisotropic etching processes.

The deposited films have applications, which include, but are not limited to, computer chips, optical devices, magnetic information storages, coatings on a supporting material or substrate, microelectromechanical systems (MEMS), nanoelectromechanical systems, thin film transistor (TFT), light emitting diodes (LED), organic light emitting diodes (OLED), IGZO, and liquid crystal displays (LCD). Potential use of resulting solid silicon doped hafnium oxide include, but not limited to, shallow trench insulation, inter layer dielectric, passivation layer, an etch stop layer, part of a dual spacer, and sacrificial layer for patterning.

EXAMPLES

In the following examples, unless stated otherwise, properties will be obtained from sample films that are deposited onto silicon wafer with resistivity of 5-20 Ω-cm as substrate or PVD TiN wafer has TiN 500 Å/Ti 50 Å/thermal $SiO_2$ 3000 Å/Si sub structure as substrate. All film depositions are performed using the CN-1 reactor has showerhead design with 13.56 MHz direct plasma. In typical process conditions, unless stated otherwise, the chamber pressure is fixed at a pressure ranging from about 1 to about 5 Torr. Additional inert gas is used to maintain chamber pressure.

The formulation is delivered as vapors using direct liquid injection (DLI) system (MSP Corp, USA). Typical RF power used is 300 W over electrode area of 200 mm wafer. The film depositions comprise the steps listed in Table 1 for thermal ALD and plasma enhanced ALD. Steps a through d in Table 1 constitute one ALD or PEALD cycle and are repeated, unless otherwise specified, a total of 100 or 200 or 300 or 500 times to get the desired film thickness.

The reactive index (RI) and thickness for the deposited films are measured using an ellipsometer. Film non-uniformity is calculated using the standard equation: % non uniformity=((max thickness−min thickness)/(2*average (avg) thickness)). Film structure and composition are analyzed using Fourier Transform Infrared (FTIR) spectroscopy and X-Ray Photoelectron Spectroscopy (XPS). The density for the films is measured with X-ray Reflectometry (XRR).

TABLE 1

Deposition Steps in ALD Silicon Doped Hafnium Oxide Films

Step a  Introduce vapors of the formulation to the reactor; additional inert gas is used to maintain chamber pressure to provide a chemisorbed layer
b  Purge unreacted formulation precursor from the reactor chamber with inert gas
c  Introduce an oxygen-containing source with or without activating plasma to react with the surface of the chemisorbed layer and create reactive sites
d  Purge reaction by-products out Example 1

ALD Silicon Doped Hafnium Oxide Using about 4.4 Wt. % of Bis(Dimethylamino)Dimethylsilane in a Formulation Comprising Bis(Dimethylamino)Dimethylsilane and Tetrakis(Dimethylamino)Hafnium and Ozone as Oxygen-Containing Source The silicon wafer was loaded into the CN-1 reactor equipped with showerhead design with 13.56 MHz direct plasma and heated to 200° C., or 250° C., or 300° C. with chamber pressure of 1 torr.

4.4 wt. % of bis(dimethylamino)dimethylsilane in a formulation comprising bis(dimethylamino)dimethylsilane and tetrakis(dimethylamino)hafnium as the formulation was delivered using DLI into the reactor with a flow of 50 mg/min or 100 mg/min through an atomizer.

The ALD cycle was comprised of the process steps provided in Table 1 and uses the following process parameters:
 a. Introduce the formulation precursor to the reactor
    Argon flow: 1000 sccm
    Formulation precursor pulse: 1 to 5 seconds
 b. Inert gas purge
    Argon flow: 1000 sccm
    Purge time: 20 seconds
 c. Introduce ozone
    Argon flow: 1000 sccm
    Ozone pulse: 5 to 20 seconds
 d. Purge
    Argon flow: 1000 sccm
    Purge time: 20 seconds

TABLE 2

Summary of deposition conditions and XPS results.

| Substrate Temp, ° C. | Precursor/purge/ Ozone/Purge | Sub | THK Å | Hf (at. %) | O (at. %) | Si (at. %) | Si/(Si + Hf) (mol %) |
|---|---|---|---|---|---|---|---|
| 200[a] | 6/20/20/20 | Si | 170 | 31.39 | 66.43 | 2.19 | 6.51% |
| 250[a] | 6/20/20/20 | Si | 235 | 32.63 | 65.87 | 1.74 | 5.06% |
| 250[a] | 6/20/20/20 | TiN | NA | 32.15 | 66.07 | 1.78 | 5.25% |
| 250[a] | 3/20/10/20 | TiN | NA | 31.63 | 66.20 | 2.17 | 6.43% |
| 250[b] | 3/20/20/20 | Si | 150 | 34.02 | 63.50 | 2.49 | 6.81% |
| 250[b] | 3/20/20/20 | TiN | NA | 33.65 | 63.91 | 2.44 | 6.77% |
| 300[a] | 6/20/20/20 | Si | 265 | 32.32 | 65.74 | 1.94 | 5.66% |
| 300[a] | 6/20/20/20 | TiN | NA | 32.16 | 65.81 | 2.03 | 5.94% |

[a]LFC flow rate = 100 mg/min;
[b]LFC flow rate = 50 mg/min

Steps a to d were repeated for a certain number of cycles to provide certain thickness of silicon doped hafnium oxide having a silicon doping level in the range from 0.5 to 8 mol % as shown in Table 2.

Example 2

ALD Silicon Doped Hafnium Oxide Using about 4.4 Wt % of Bis(Dimethylamino)Dimethylsilane in a Formulation Comprising Bis(Dimethylamino)Dimethylsilane and Tetrakis(Dimethylamino)Hafnium and Water as Oxygen-Containing Source The silicon wafer is loaded into the CN-1 reactor equipped with showerhead design with 13.56 MHz direct plasma and heated to 300° C. with chamber pressure of 1 torr.

About 4.4 wt % of bis(dimethylamino)dimethylsilane in a formulation comprising bis(dimethylamino)dimethylsilane and tetrakis(dimethylamino)hafnium as the formulation precursor is delivered using DLI into the reactor with a flow of 50 mg/min through an atomizer.

The ALD cycle is comprised of the process steps provided in Table 1 and uses the following process parameters:
 a. Introduce the formulation precursor to the reactor
    Argon flow: 1000 sccm
    Formulation precursor pulse: 1 to 5 seconds
 b. Inert gas purge
    Argon flow: 1000 sccm
    Purge time: 20 seconds
 c. Introduce water vapor
    Argon flow: 1000 sccm
    Water pulse: 1 to 10 seconds
 d. Purge
    Argon flow: 1000 sccm
    Purge time: 20 seconds Steps a to d are repeated for a certain number of cycles to provide certain thickness of silicon doped hafnium oxide having a silicon doping level in the range of 0.5 to 8 mol %, preferably 2 to 6 mol %, most preferably 3 to 5 mol %.

Example 3

ALD Silicon Doped Hafnium Oxide Using about 4.4 Wt. % of Bis(Dimethylamino)Dimethylsilane in a Formulation Comprising Bis(Dimethylamino)Dimethylsilane and Tetrakis(Dimethylamino)Hafnium and Oxygen Plasma as Oxygen-Containing Source The silicon wafer is loaded into the CN-1 reactor equipped with showerhead design with 13.56 MHz direct plasma and heated to 300° C. with chamber pressure of 1 torr.

About 4.4 wt % of bis(dimethylamino)dimethylsilane in a formulation comprising bis(dimethylamino)dimethylsilane and tetrakis(dimethylamino)hafnium as the formulation precursor is delivered using DLI into the reactor with a flow of 50 mg/min through an atomizer.

The ALD cycle is comprised of the process steps provided in Table 1 and uses the following process parameters:
 a. Introduce the formulation precursor to the reactor
   Argon flow: 1000 sccm
   Formulation precursor pulse: 1 o 5 seconds
 b. Inert gas purge
   Argon flow: 1000 sccm
   Purge time: 20 seconds
 c. Introduce oxygen plasma
   Argon flow: 1000 sccm
   Oxygen plasma pulse: 2 to 10 seconds
 d. Purge
   Argon flow: 1000 sccm
   Purge time: 20 seconds Steps a to d are repeated for a certain number of cycles to provide certain thickness of silicon doped hafnium oxide having a silicon doping level in the range of 0.5 to 8 mol %, preferably 2 to 6 mol %, most preferably 3 to 5 mol %.

Example 4

Dependence of Formulation Melting Point on Organoaminosilane Concentration

Several formulations were generated by mixing varying proportions of bis(dimethylamino)dimethylsilane with tetrakis(dimethylamino)hafnium (TDMAH).

Figure 3:
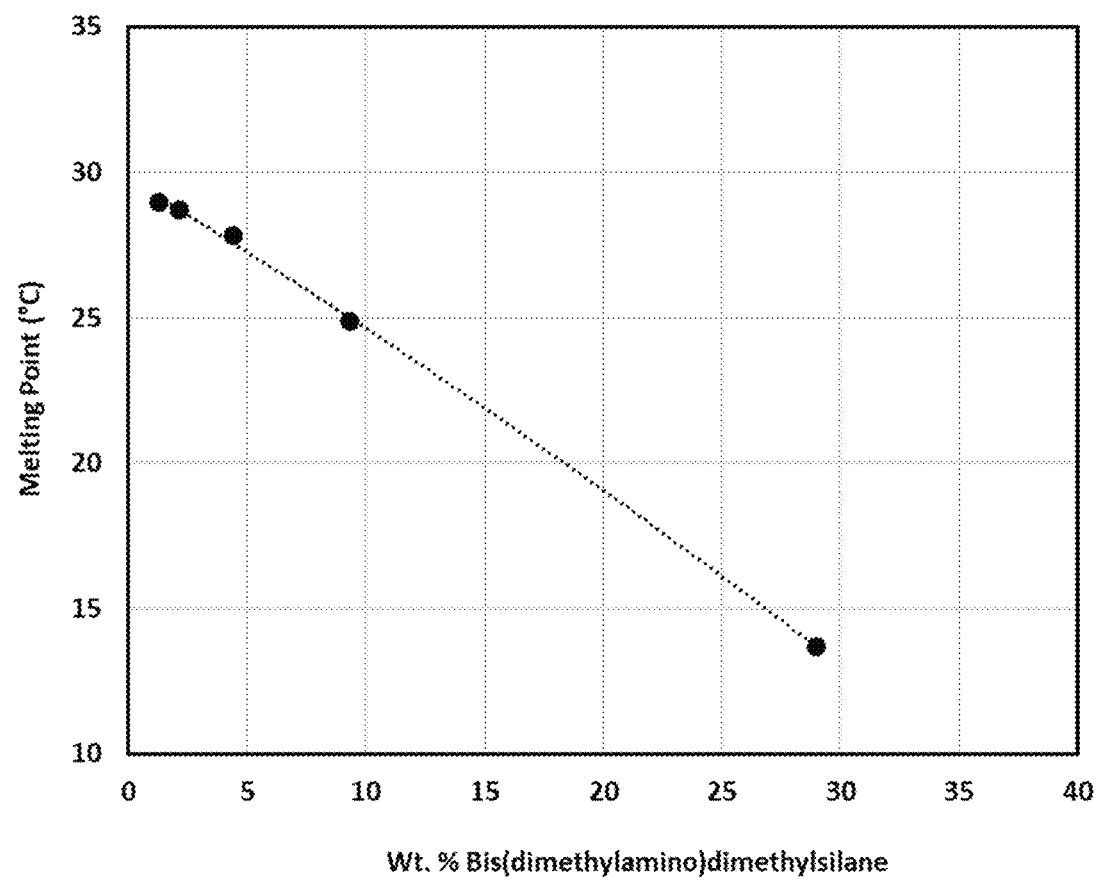
FIG. 3 provides a graph of melting point versus organoaminosilane concentration for formulations comprising varying amounts of bis(dimethylamino)dimethylsilane in tetrakis(dimethylamino)hafnium (TDMAH).

As seen in FIG. 3, by varying the concentration of bis(dimethylamino)dimethylsilane in the resulting formulation, the melting points of the formulations (measured by differential scanning calorimetry) decrease as the concentrations of bis(dimethylamino)dimethylsilane increase, allowing the melting points of the formulation to be tuned to 30° C. or lower, which are more suitable for delivering the formulation via direct liquid injection.

Example 5

Thermal Stability of about 9 Wt % Bis(Dimethylamino)Dimethylsilane in a Formulation Comprising Bis(Dimethylamino)Dimethylsilane and Tetrakis(Dimethylamino)Hafnium Approximately 1 g of a formulation comprising about 9 wt % bis(dimethylamino)dimethylsilane in tetrakis(dimethylamino)hafnium (TDMAH) was heated for 7 days at 60° C. in a sealed stainless steel tube under nitrogen.

Analysis by $^1$H and $^{13}$C NMR spectroscopy showed no detectable degradation or change in composition, suggesting the formulation is stable and suitable for vapor deposition because both organoaminosilane and organoaminohafnium components have the same amino group, i.e. dimethylamino group.

Comparative Example 5

Formulations Comprising Bis(Dimethylamino)Methylsilane and Tetrakis(Dimethylamino)Hafnium Several formulations were generated by adding various amounts of bis(dimethylamino)methylsilane to tetrakis(dimethylamino)hafnium. When the liquid phase of these mixtures was analyzed by $^1$H and $^{13}$C NMR spectroscopy, bis(dimethylamino)methylsilane and tetrakis(dimethylamino)hafnium were identified as the major components along with significant amounts of tris(dimethylamino)methylsilane and several other impurities consistent with dimethylaminohafnium hydride species. This indicates that amino/hydride exchange had occurred between bis(dimethylamino)methylsilane having one Si—H group and tetrakis(dimethylamino)hafnium and that they are not compatible with each other for the purpose of this invention.

The foregoing examples and description of the embodiments should be taken as illustrating, rather than as limiting the present invention as defined by the claims. As will be readily appreciated, numerous variations and combinations of the features set forth above can be utilized without departing from the present invention as set forth in the claims. Such variations are intended to be included within the scope of the following claims.

The invention claimed is:

1. A method to deposit a film comprising silicon, hafnium and oxygen onto a substrate, comprising:
  a) providing the substrate in a reactor;
  b) introducing into the reactor a composition comprising:
    (i) at least one organoaminosilane precursor compound having a formula of $R_xR^3Si(NR^1R^2)_{3-x}$;
    wherein
    R is a linear or branched $C_1$ to $C_6$ alkyl;
    $R^1$, $R^2$ and $R^3$ are independently selected from linear or branched $C_1$ to $C_6$ alkyl; wherein
      $R^1$ and $R^2$ in organoamino group are linked to form a cyclic ring structure; or not linked to form a cyclic ring structure;
    x=0, 1, or 2;
    and
    (ii) at least one organoaminohafnium precursor compound having a formula of $L_xHf(NR^1R^2)_{4-x}$;
    wherein
    L is cyclopentadienyl or alkyl substituted cyclopentadienyl;
    $R^1$ and $R^2$ are independently selected from linear or branched $C_1$ to $C_6$ alkyl in organoamino group; wherein
      $R^1$ and $R^2$ are linked to form a cyclic ring structure or $R^1$ and $R^2$ are not linked to form a cyclic ring structure; and
    x=0, 1, or 2;
  c) purging the reactor with a purge gas;
  d) introducing an oxygen-containing source into the reactor; and
  e) purging the reactor with the purge gas;

wherein
melting point of the composition is ≤30° C.;
the at least one organoaminosilane precursor and the at least one organoaminohafnium precursor have the same organoamino group;
the oxygen-containing source is selected from the group consisting of an oxygen plasma, ozone, a water vapor, water vapor plasma, nitrogen oxide plasma, a carbon oxide plasma, and combinations thereof;
the purge gas is selected from the group consisting of argon (Ar), nitrogen ($N_2$), helium (He), neon, hydrogen ($H_2$), and combinations thereof;
deposition process is selected from the group consisting of a thermal atomic layer deposition (ALD), plasma enhanced atomic layer deposition (PEALD) process, and combinations thereof;
the method is conducted at a temperature ranging from 100° C. to 600° C.; and
b) through e) are repeated until a desired thickness of film is deposited.

2. The method of claim 1, wherein the composition is delivered via direct liquid injection.

3. The method of claim 1, wherein the composition comprises
the at least one organoaminosilane precursor compound is selected from the group consisting of tris(dimethylamino)methylsilane, tris(diethylamino)methylsilane, tris(ethylmethylamino)methylsilane, tris(pyrrolidino)methylsilane, tris(dimethylamino)ethylsilane, tris(diethylamino)ethylsilane, tris(ethylmethylamino)ethylsilane, tris(pyrrolidino)ethylsilane, bis(dimethylamino)dimethylsilane, bis(diethylamino)dimethylsilane, bis(ethylmethylamino)dimethylsilane, bis(pyrrolidino)dimethylsilane, bis(dimethylamino)diethylsilane, bis(diethylamino)diethylsilane, bis(ethylmethylamino)diethylsilane, bis(pyrrolidino)diethylsilane, dimethylaminotrimethylsilane, diethylaminotrimethylsilane, ethylmethylaminotrimethylsilane, pyrrolidinotrimethylsilane, dimethylaminotriethylsilane, diethylaminotriethylsilane, ethylmethylaminotriethylsilane, pyrrolidinotriethylsilane, dimethylaminophenyldimethylsilane, diethylaminophenyldimethylsilane, ethylmethylaminophenyldimethylsilane, pyrrolidinophenyldimethylsilane, tris(dimethylamino)phenylsilane, tris(diethylamino)phenylsilane, tris(ethylmethylamino)phenylsilane, tris(pyrrolidino)phenylsilane, 1-dimethylamino-1,1,3,3,3-pentamethyldisiloxane, 1,1,1,4,4,4-hexakis(dimethylamino)-1,4-disilabutane, 2,5-bis(dimethylamino)-2,5-dimethyl-2,5-disilahexane and combinations thereof;
and
the at least one organoaminohafnium precursor compound is selected from the group consisting of tetrakis(dimethylamino)hafnium (TDMAH), tetrakis(diethylamino)hafnium (TDEAH), tetrakis(ethylmethylamino)hafnium (TEMAH), tetrakis(pyrrolidino)hafnium, cyclopentadienyltris(dimethylamino)hafnium (CpHf($NMe_2)_3$), methylcyclopentadienyltris(dimethylamino)hafnium (MeCpHf($NMe_2)_3$), ethylcyclopentadienyltris(dimethylamino)hafnium (EtCpHf($NMe_2)_3$), cyclopentadienyltris(ethylmethylamino)hafnium (CpHf($NMeEt)_3$), methylcyclopentadienyltris(ethylmethylamino)hafnium (MeCpHf($NMeEt)_3$), ethylcyclopentadienyltris(ethylmethylamino)hafnium (EtCpHf($NMeEt)_3$), cyclopentadienyltris(diethylamino)hafnium (CpHf($NEt_2)_3$), methylcyclopentadienyltris(diethylamino)hafnium (MeCpHf($NEt_2)_3$), ethylcyclopentadienyltris(diethylamino)hafnium (EtCpHf($NEt_2)_3$), bis(cyclopentadienyl)bis(dimethylamino)hafnium ($Cp_2$Hf($NMe_2)_2$), bis(methylcyclopentadienyl)bis(dimethylamino)hafnium (($MeCp)_2$Hf($NMe_2)_2$), bis(ethylcyclopentadienyl)bis(dimethylamino)hafnium (($EtCp)_2$Hf($NMe_2)_2$), bis(cyclopentadienyl)bis(ethylmethylamino)hafnium ($Cp_2$Hf($NMeEt)_2$), bis(methylcyclopentadienyl)bis(ethylmethylamino)hafnium (($MeCp)_2$Hf($NMeEt)_2$), bis(ethylcyclopentadienyl)bis(ethylmethylamino)hafnium (($EtCp)_2$Hf($NMeEt)_2$), bis(cyclopentadienyl)bis(diethylamino)hafnium (($Cp_2$Hf($NEt_2)_2$), bis(methylcyclopentadienyl)bis(diethylamino)hafnium (($MeCp)_2$Hf($NEt_2)_3$), bis(ethylcyclopentadienyl)bis(diethylamino)hafnium (($EtCp)_2$Hf($NEt_2)_2$), (N-methyl-2,4-cyclopentadiene-1-ethanamino]bis(dimethylamino)hafnium, (N-ethyl-2,4-cyclopentadiene-1-ethanamino]bis(dimethylamino)hafnium, (N-methyl-2,4-cyclopentadiene-1-ethanamino]bis(diethylamino)hafnium, (N-ethyl-2,4-cyclopentadiene, 1-ethanamino]bis(diethylamino) hafnium, (N-methyl-2,4-cyclopentadiene-1-ethanamino]bis(ethylmethylamino)hafnium, (N-ethyl-2,4-cyclopentadiene-1-ethanamino]bis(ethylmethylamino)hafnium, and combinations thereof.

4. The method of claim 1, wherein the composition comprises bis(dimethylamino)dimethylsilane; and tetrakis(dimethylamino)hafnium.

5. The method of claim 1, wherein the composition further comprises (iii) a solvent selected from the group consisting of ether, tertiary amine, alkyl hydrocarbon, aromatic hydrocarbon, siloxanes, tertiary aminoether, and combinations thereof.

6. The method of claim 1, wherein the composition is delivered via direct liquid injection into the reactor.

7. The method of claim 1, wherein the oxygen-containing source further comprises an inert gas selected from the group consisting of argon, helium, nitrogen, hydrogen, and combinations thereof.

8. The method of claim 1, wherein the at least one organoaminosilane precursor compound has a range selected from the group consisting of 0.10 to 99.90 wt. %, 0.10 to 30.00 wt. %, 0.10 to 20.00 wt. %, 0.10 to 10.00 wt. %, 5.00 to 30.00 wt. %, 5.00 to 20.00 wt. %, 5.00 to 10.00 wt. %, and 0.10 to 5.00 wt. %; and the at least one organoaminohafnium precursor compound has a range selected from the group consisting of 0.10 to 99.00 wt. %, 0.10 to 30.00 wt. %, 0.10 to 20.00 wt. %, 0.10 to 10.00 wt. %, 5.00 to 30.00 wt. %, 5.00 to 20.00 wt. %, 5.00 to 10.00 wt. %, and 0.10 to 5.00 wt. %.

9. The method of claim 1, wherein the composition further comprises (iii) a solvent selected from the group consisting of ether, tertiary amine, alkyl hydrocarbon, aromatic hydrocarbon, siloxanes, tertiary aminoether, and combinations thereof; the at least one organoaminosilane precursor compound has a range selected from the group consisting of 0.10 to 99.90 wt. %, 10.00 to 90.00 wt. %, 20.00 to 80.00 wt. %, 30.00 to 70.00 wt. %, and 40.00 to 60.00 wt. %; and the at least one organoaminohafnium precursor compound has a range selected from the group consisting of 0.10 to 99.00 wt. %, 10.00 to 90.00 wt. %, 20.00 to 80.00 wt. %, 30.00 to 70.00 wt. %, and 40.00 to 60.00 wt. %.

* * * * *